(12) United States Patent
Conard, III

(10) Patent No.: US 7,242,226 B1
(45) Date of Patent: Jul. 10, 2007

(54) METHOD AND APPARATUS FOR AVOIDING FALSE SWITCHING IN AN ELECTRONIC DEVICE

(75) Inventor: Theodore Hogeland Conard, III, Los Altos, CA (US)

(73) Assignee: Cisco Technology, Inc., San Jose, CA (US)

( * ) Notice: Subject to any disclaimer, the term of this patent is extended or adjusted under 35 U.S.C. 154(b) by 173 days.

(21) Appl. No.: 10/911,434

(22) Filed: Aug. 3, 2004

(51) Int. Cl.
*H03B 1/00* (2006.01)

(52) U.S. Cl. .................. 327/108; 327/333; 326/80; 326/81; 326/86

(58) Field of Classification Search ............ None
See application file for complete search history.

(56) References Cited

U.S. PATENT DOCUMENTS

| | | | | |
|---|---|---|---|---|
| 4,061,929 A | * | 12/1977 | Asano | 327/589 |
| 5,742,183 A | * | 4/1998 | Kuroda | 326/81 |
| 5,808,502 A | * | 9/1998 | Hui et al. | 327/333 |
| 5,963,080 A | * | 10/1999 | Miske et al. | 327/534 |
| 6,052,019 A | * | 4/2000 | Kwong | 327/437 |
| 6,400,189 B2 | * | 6/2002 | McDaniel | 327/108 |
| 6,559,703 B1 | * | 5/2003 | Kwong et al. | 327/313 |
| 6,724,226 B2 | * | 4/2004 | Kim | 327/108 |

* cited by examiner

*Primary Examiner*—Tuan T. Lam
(74) *Attorney, Agent, or Firm*—Sierra Patent Group, Ltd.

(57) ABSTRACT

A system and method for reducing forward inadvertent biasing of a switch having a transistor. The gate of the transistor is connected to ground and a voltage source less than ground. A control signal of the gate is then applied to a level translator to compensate for the voltage applied to the gate.

3 Claims, 3 Drawing Sheets

METHOD AND APPARATUS FOR AVOIDING FALSE SWITCHING IN AN ELECTRONIC DEVICE

FIELD OF THE INVENTION

This invention relates to preventing inadvertent forward biasing of a FET transistor used as a Switch. More particularly, this invention relates to reducing false forward biasing of the transistor, caused by signal undershot on either a source or a drain of a FET transistor.

PRIOR ART

In digital systems, it is common to use a FET Transistor as a switch. In these digital systems, signal quality is a concern. One particular use of transistors as a switch in a bus switch. A bus switch is a group of FET transistors in an integrated package used for switching applications. The bus switch may also be used to connect a daugtherboard or line card to a motherboard. One problem in the use of the transistor in a bus switch integrated circuit is undershoot. Undershoot is a reflection of a signal over a line carrying the signal. A signal reflection (which is below ground reference) can accidentally create a positive bias between the gate (the gate is driven by a signal reference to ground inside the bus switch) of an N-channel FET transistor at the source or the drain of the transistor. This causes the transistor to be forward biased, inappropriately allowing current to flow between the source and the drain during the undershoot. This may cause a malfunction of the circuit.

In the past one method that has been implemented to prevent undershoot is to connect clamping diodes to a source and drain of the transistor. However, the diodes only prevent an undershoot after the turn-on time of the diode. Thus, there are still brief periods during which an undershoot can occur before a diode is clamping the undershoot. If undershoots happen often enough, the undershoots can pump charge to the non-selected side of the switch. For example if the non-selected side is used as a clock or a control signal, the undershoot inappropriately biasing the transistor, may act as a charge pump and cause an incorrect logic value which in turn may cause inappropriate circuit behavior. Thus, there is a need in the art for a method for preventing inappropriate forward biasing caused by an undershoot.

SUMMARY OF THE INVENTION

The above and other problems are solved and an advance in the art is made by the method and apparatus of the present invention. A system for preventing overshoot in accordance with this invention provides continuous prevention of overshoot. Thus, the possibility of frequent overshoots acting as a charge pump is greatly reduced.

In accordance with this invention, a gate of a transistor acting as a switch connected to a power source that applies a voltage that is lower than logic ground of the digital system to which the transistor is connected. This prevents a negative charged reflection from causing forward biasing between a source or drain and the gate of the transistor. In order to operate correctly, the control signal to the gate may have to be applied to a level translator in order to be interpreted as a valid digital logic "1" or "0" by the bus switch.

BRIEF DESCRIPTION OF THE DRAWINGS

The above and other features and advantages of this invention are described in the following description and shown in the following drawings.

DETAILED DESCRIPTION

Figure 1:
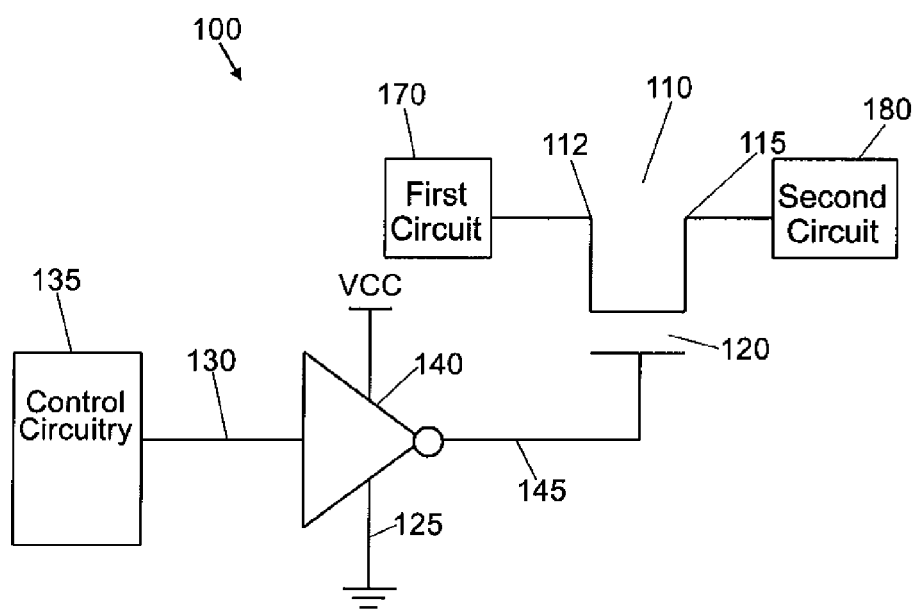
FIG. 1 illustrating a prior art bus switch integrated circuit.

This invention relates to a system for reducing signal undershoots from causing inadvertent forward biasing of a transistor used as a switch. This invention is described below in a manner that allows one skilled in the art to design and use a system in accordance with this invention. When possible, like reference numerals have been used in the accompanying figures to describe the same or like elements of this invention.

This invention relates to a system for reducing forward biasing caused by an undershoot in a switch. More particularly, this invention relates to reducing forward biasing caused by undershoots in transistors used as bus switches. One skilled in the art will recognize that a bus can have multiple lines and that there may be a switch on each particular line. Only one line is shown to provide an understanding of this invention. However, this invention may be applied to each bus switch connecting to a bus.

FIG. 1 illustrates a common prior art bus switch 100. Bus switch 100 includes a transistor 110. Preferably, transistor 110 is a n-channel FET transistor. Transistor 100 has a source 112, drain 115 and a gate 120. Source 112 is connected to first circuit 170. One skilled in the art will recognize that first circuit 170 may be circuitry on a daughter board connected to a bus. Drain 115 connects to second circuit 180. Second circuit 180 may be circuitry on a motherboard that connects to a bus. One skilled in the art will recognize that source 112 and drain 115 may be interchanged depending upon the exact configuration of the system Gate 120 is connected to ground 125 through buffer 140 and via path 145. Control circuitry 135 is connected to gate 120 through buffer 140 via paths 130 and 145. Control circuitry transmits a control signal to gate 120 to activate and de-activate gate 120.

It is a problem that sometimes a signal is transmitted from first circuit 170 to second circuit 180 via transistor 110. This signal is then reflected in second circuit 180 applying a negative voltage to the source or drain of transistor 110 inadvertently forward biasing the gate of the transistor. For example, the Vcc of exemplary circuit is 4.3 volts to allow signals of 3.3 volts to pass without being attenuated. Gate 120 has a threshold voltage of about 0.7 volts and the control signal applied to gate 120 is held high. If an undershoot occurs that is below −0.7 volts (ground-threshold voltage), transistor 110 is forward biased between gate 120 and source 111.

Figure 2:
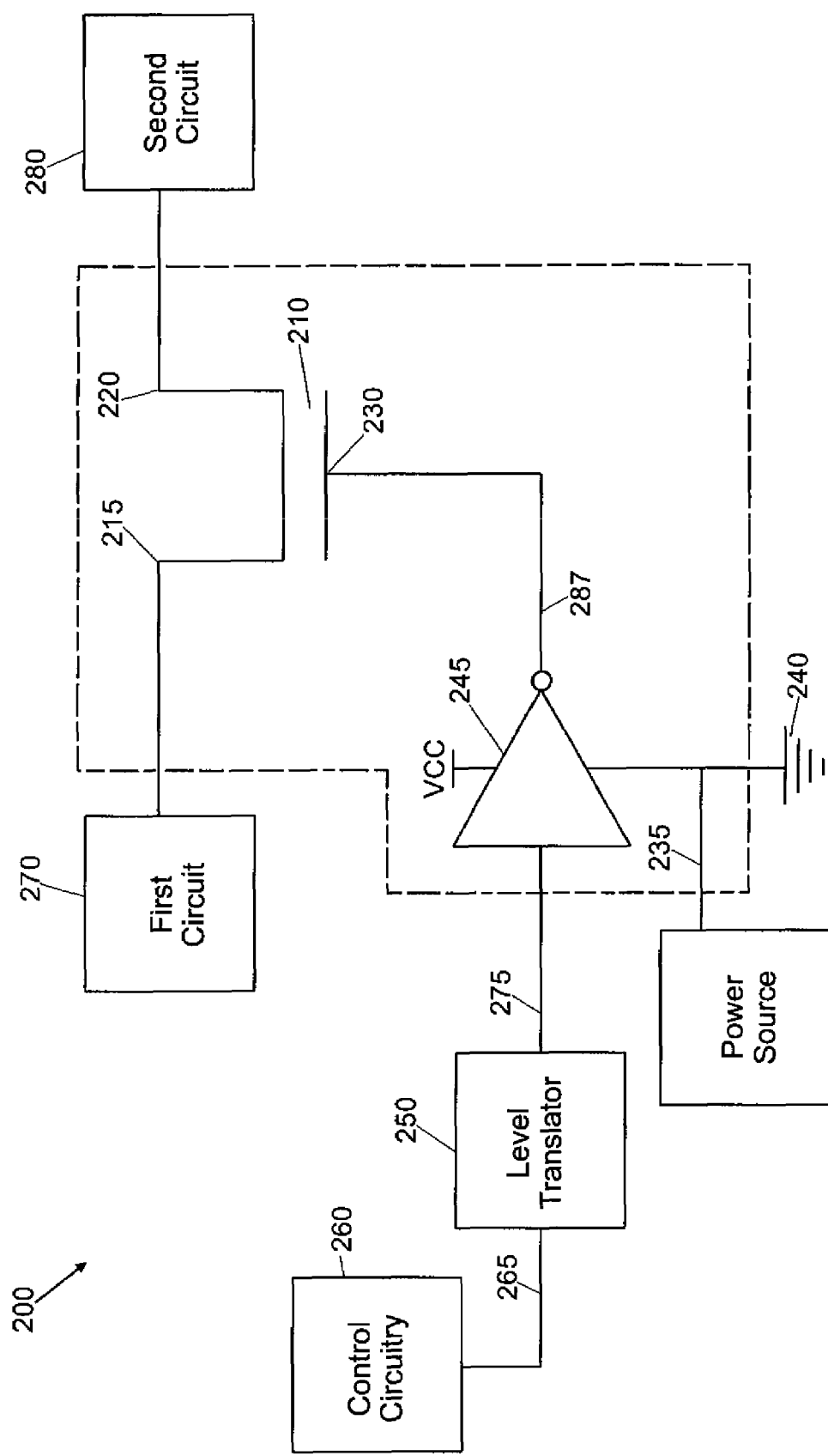
FIG. 2 illustrating a bus switch integrated circuit in accordance with an exemplary embodiment of this invention.

FIG. 2 illustrates circuitry to reduce the inadvertent forward biasing caused by an undershoot. Bus switch 200 includes a transistor 210. Preferably, transistor 210 is a n-channel FET transistor. Transistor 210 has a source 215, drain 220 and a gate 230. Source 215 is connected to first circuit 270. One skilled in the art will recognize that first circuit 170 may be circuitry on a daughter board connected to a bus. Drain 220 connects to second circuit 280. Second circuit 280 may be circuitry on a motherboard that connects to a bus. One skilled in the art will recognize that source 215 and drain 220 may be interchanged depending upon the exact configuration of the system.

Gate 230 is connected to ground 240 through buffer 245 and via path 287. Gate 230 is also connected to a power source 285 through buffer 245 that produces an "off" voltage that is less than the voltage of ground. This biases the gate to a value less than ground control circuitry 135 is connected to gate 230 through buffer 245 via paths 275 and 287. Control circuitry transmits a control signal to gate 230 to activate and de-activate gate 230. In order to overcome the inadvertent biasing of gate 230 (when gate 230 is biased in the "off" condition) the control signal, has an output low from buffer 245 that is referenced to a negative voltage through a level translator 250.

Switch 200 operates in the following exemplary manner. Bus switch 200 operates with a 5.5 volt difference between the Vcc and ground pins. The Vcc is 4.3 volts to allow a 3.3 volt signal to pass with being attenuated. Power source 285 supplies a voltage of −1.2 volts to gate 230. In this example signals from first circuit 270 and second circuit 280 are not affected. However, the control signal from control circuit 260 must change to reference an output low from 0 volts to instead reference the output to a negative −1.2 volts. This prevents an overshoot of down to about −1.9 volts from inadvertently biasing gate 240 and source 210.

Figure 3:
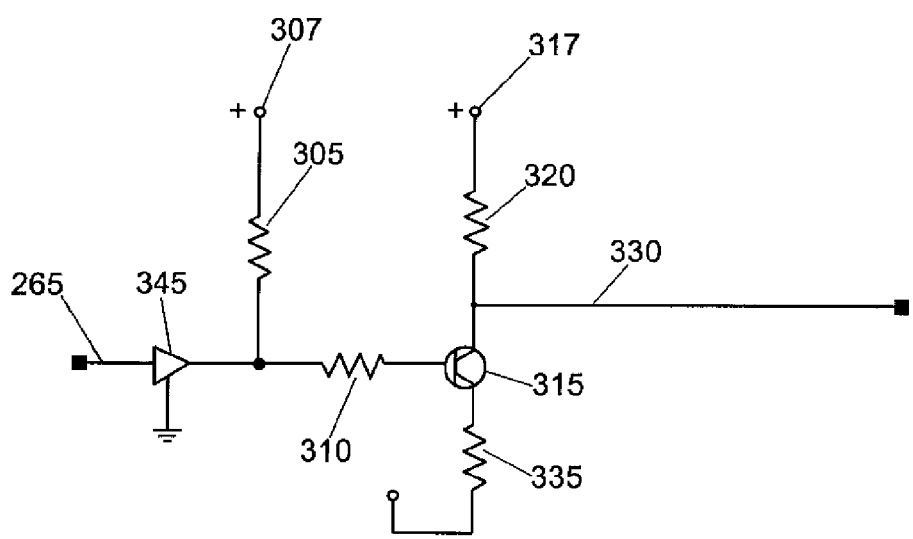
FIG. 3 illustrating a level translator for connecting to a control circuit in accordance with an exemplary embodiment of this invention.

FIG. 3 illustrates a -level translator 300. In level translator 300, buffer 345 has an input connected to control circuitry 260 (FIG. 2) via path 265. Buffer 345 is also connected to ground. One skilled in the art will recognize that buffer 345 may be buffer 245 of FIG. 2 integrated into translator 300. The output of buffer 345 is connected to first resistor 305 and second resistor 310. The first resistor 310 is connected between the output of buffer 345 and a positive power source 307. In the exemplary embodiment, the positive power source is 3.3 volts. Second resistor 310 is connected to first resistor 305 and the output of buffer 345 on one end and to the gate of transistor 315 on a second end. The emitter of the PNP transistor 315 is connected to positive voltage source 317 through third resistor 320 and to gate 230 of transistor 210 (FIG. 2) via path 330. The collector of transistor 315 is connected ground through fourth resistor 335. This circuits translates the control signals to an appropriate level to be read as logical "1" and logical "0" by gate 230.

The above and other exemplary embodiments describe in this invention as set forth in following claims. It is expected that those skilled in the art can and will design other embodiments of this invention that infringe on this invention as set forth in the following claims either literally or through the Doctrine of Equivalents.

What is claimed is:

1. A switch comprising:
   a switch transistor;
   a source of said switch transistor connected to a first circuit;
   a drain of said switch transistor connected to a second circuit;
   a gate of said switch transistor;
   a buffer connected to said gate of said switch transistor wherein said buffer connects said gate to ground and to control circuitry that provides a control signal to said gate;
   a power source connected to said buffer and ground wherein said power source provides a voltage to said gate through said buffer that is less than ground to bias said gate; and
   a translator connected to said buffer and said control circuitry to increase a voltage of said control signal to overcome said voltage from said power source connected to said buffer.

2. The switch of claim 1 wherein said translator comprises:
   a first resistor connected between a positive power source and an output of said-buffer,
   a second resistor having an input connected to said output buffer and an output of said first resistor and an output connected to a gate of a translator transistor,
   a third resistor connected between an emitter of said translator transistor and a positive power source, and a fourth resistor connected between said collector of said translator transistor and ground; and
   said gate of said transistor is connected to ground through said fourth resistor and is connected to said collector of said translator transistor.

3. The switch of claim 1 wherein ground is 0 volts, said voltage of said power source is −1.2 volts and voltage passing through said transistor from source to drain is 1.9 volts.

* * * * *